(12) United States Patent
Goldstein et al.

(10) Patent No.: US 10,084,423 B1
(45) Date of Patent: Sep. 25, 2018

(54) SYSTEM AND METHOD FOR CONTROLLING VOLUME

(71) Applicant: CRACKLE, INC., Culver City, CA (US)

(72) Inventors: Aaron Goldstein, Los Angeles, CA (US); Christine Coner, Los Angeles, CA (US); Ihor Yaskiw, Santa Monica, CA (US)

(73) Assignee: CRACKLE, INC., Culver City, CA (US)

( * ) Notice: Subject to any disclaimer, the term of this patent is extended or adjusted under 35 U.S.C. 154(b) by 0 days.

(21) Appl. No.: 15/656,538

(22) Filed: Jul. 21, 2017

(51) Int. Cl.
| | |
|---|---|
| *H03G 3/32* | (2006.01) |
| *G06F 3/16* | (2006.01) |
| *G06F 3/14* | (2006.01) |
| *G10L 25/84* | (2013.01) |
| *H04N 7/088* | (2006.01) |
| *H04R 29/00* | (2006.01) |

(52) U.S. Cl.
CPC ............... *H03G 3/32* (2013.01); *G06F 3/14* (2013.01); *G06F 3/165* (2013.01); *G10L 25/84* (2013.01); *H04N 7/0885* (2013.01); *H04R 29/001* (2013.01)

(58) Field of Classification Search
CPC .. H03G 3/32; G06F 3/14; G06F 3/165; H04N 7/0885; H04R 29/001

USPC .......................................................... 381/57
See application file for complete search history.

(56) References Cited

U.S. PATENT DOCUMENTS

| | | | |
|---|---|---|---|
| 7,586,549 B2 | 9/2009 | Heo | |
| 2010/0074450 A1 | 3/2010 | Liao | |
| 2014/0078404 A1 | 3/2014 | Cheung | |
| 2016/0330396 A1* | 11/2016 | Garcia Navarro | ...... G10L 21/10 |
| 2017/0289486 A1* | 10/2017 | Stroffolino | ......... H04N 5/44513 |

OTHER PUBLICATIONS

Kabir, et al., "Correlation Based Automatic Volume Control System for Television/ Radio" International Journal of Computing and Digital Systems @ 2014: Scientific Publishing Center, University of Bahrain, Published May 1, 2014, pp. 151-160.

* cited by examiner

*Primary Examiner* — David Ton
(74) *Attorney, Agent, or Firm* — Stuart H. Mayer; Mayer & Williams PC

(57) ABSTRACT

Systems and methods provide a solution to a common nuisance of loud background noise encountered when watching television, allowing the issue to be solved with little or no user interaction. Systems and methods automatically modulate device volume based on background noise level. The systems and methods record a background level of noise, and if that background level of noise increases, the systems and methods automatically increase the content volume which had been set by the user. Exceptions are made for brief sounds or for viewer conversations.

18 Claims, 4 Drawing Sheets

SYSTEM AND METHOD FOR CONTROLLING VOLUME

CROSS-REFERENCE TO RELATED APPLICATIONS

Field

The invention relates to automatic control of volume in a listening environment.

Background

Background noise is an issue that the vast majority of consumers are familiar with. A user may be watching television, and a distracting background sound enters the picture, e.g., a dishwasher turns on, loud music starts playing in the distance, street noise kicks up, to name a few examples. The user's solution is generally to pause playback or to turn up the volume. But then they have to turn it back down a few minutes later, after the noise has subsided. In many cases, the TV may have been turned up loud enough that the user's own neighbors may become annoyed, causing them to turn up their own content playback devices. This can be particularly frustrating if the noise comes in waves, e.g., the user lives under a flight path, forcing the user to repeat the process over and over. This process can further cost considerable power, both in terms of the content playback device itself and also for the user's remote control, which is often battery powered, and thus for which power consumption is a serious issue. Wear and tear are on these devices may also subsequently ensue. Currently no solution exists to mitigate this common issue.

This Background is provided to introduce a brief context for the Summary and Detailed Description that follow. This Background is not intended to be an aid in determining the scope of the claimed subject matter nor be viewed as limiting the claimed subject matter to implementations that solve any or all of the disadvantages or problems presented above.

SUMMARY

Systems and methods according to present principles meet the needs of the above in several ways, and in particular provide a solution to the above-noted common nuisance, allowing the issue to be solved with little or no user interaction. Systems and methods according to present principles automatically modulate device volume based on background noise level. As will be described below, systems and methods according to present principles record a background level of noise, and if that background level of noise increases, the systems and methods automatically increase the content volume which had been set by the user. Exceptions are made for brief sounds or for viewer conversations. Details are provided below In one aspect, the invention is directed towards a method of improving delivery of audio content during a content playback experience, including: a. detecting an initial BBNL; b. determining a desired CAL; c. detecting a sustained increase in the BBNL; and d. automatically causing an increase in the CAL to compensate for the detected sustained increase in the BBNL.

Implementations of the invention may include one or more of the following. The method may further include automatically causing display of closed-captioning to further compensate for the detected sustained increase in the BBNL. The method may further include causing the CAL to decrease when the increased BBNL is no longer detected. The increase in the CAL may be at least proportional to the increase in the BBNL. The method may further include determining a metric based on the initial BBNL and the desired CAL, where the automatic increase in the CAL is such that the value of the metric is unchanged. The metric may be a signal-to-noise ratio. The method may further include detecting proximate speech, where if proximate speech is detected, and if the proximate speech causes an increase in the BBNL, then suppressing the automatic increase in the CAL caused by the increase in BBNL due to the proximate speech. The method may further include detecting if the increase in BBNL exceeds a threshold, and if so, then performing the automatic increase in the CAL. The sustained increase may be a sound increase greater than a predetermined threshold and which does not constitute an excepted BBNL increase. An excepted BBNL increase may be one that is determined to be proximate speech or one that has a duration less than a predetermined threshold period of time. The predetermined threshold period of time may be one second. The predetermined threshold of the sound increase may be 75 dB.

In another aspect, the invention is directed towards a method of improving delivery of audio content during a content playback experience, including: a. detecting an initial BBNL; b. determining a desired CAL; c. detecting a sustained increase in the BBNL; and d. automatically causing display of closed-captioning to compensate for the detected sustained increase in the BBNL.

Implementations may include further automatically causing an increase in the CAL to further compensate for the detected sustained increase in the BBNL.

In another aspect, the invention is directed towards a system with improved delivery of audio content during a content playback experience, including: a. a network interface for receiving digital content; b. a display for displaying received digital content; c. a microphone for detecting an initial BBNL; d. a means for determining a desired CAL; e. a volume control module configured to control a playback volume of the digital content; f. a closed captioning module configured to, upon receipt of a closed captioning command, display closed captioning of the received digital content; and g. a sound adjustment module configured to receive an input from the microphone, and if the input from the microphone detects a sustained increase in the BBNL, then the sound adjustment module is configured to command the volume control module to automatically cause an increase in the CAL to compensate for the detected sustained increase in the BBNL, or to command the closed captioning module to display closed captioning of the received digital content, or both.

Implementations of the invention may include one or more of the following. The sound adjustment module may be further configured to, upon detecting a decrease in the BBNL, command the volume control module to automatically cause a decrease in the CAL, or command the closed captioning module to suppress display of closed captioning of the received digital content, or both. The sustained increase may be a sound increase greater than a predetermined threshold and which does not constitute an excepted BBNL increase. An excepted BBNL increase is one that is determined to be proximate speech or one that has a duration less than a predetermined threshold period of time. The predetermined threshold period of time may be one second. The predetermined threshold of the sound increase may be 75 dB.

Advantages of the invention may include, in certain embodiments, one or more of the following. Systems and methods may be conveniently implemented within virtually any application that involves audio playback in a changing environment, particularly homes and businesses, but also theaters and the like. Systems and methods are applicable to virtually all consumer electronics that involve audio playback. Other advantages will be understood from the description that follows, including the figures and claims.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter. The claimed subject matter is not limited to implementations that solve any or all disadvantages noted in any part of this disclosure.

BRIEF DESCRIPTION OF THE DRAWINGS

Like reference numerals refer to like elements throughout. Elements are not to scale unless otherwise noted.

DETAILED DESCRIPTION

Figures 1A, 1B, 1C:
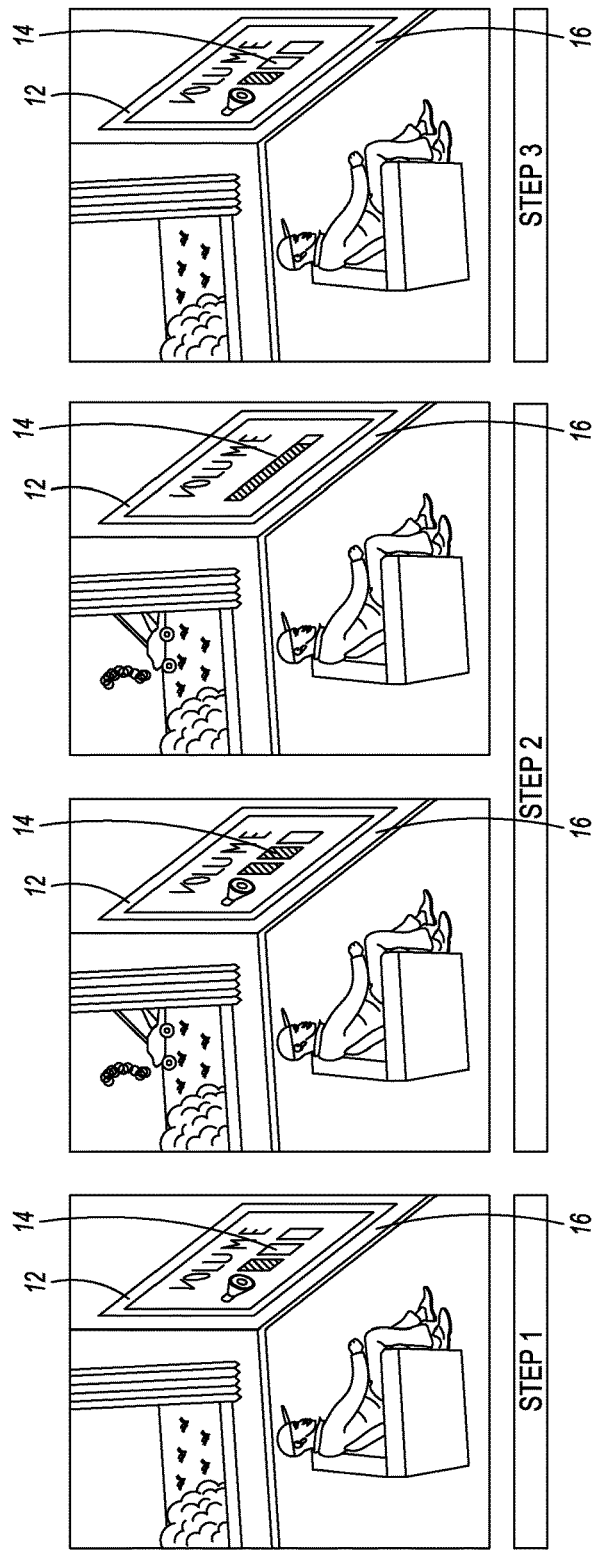
FIGS. 1A, 1B, and 1C show an exemplary situation in which systems and methods according to present principles may be embodied.

Systems and methods according to present principles monitor and detect changes in background noise during a media consumption session and subsequently mitigate the same via automatic volume modulation and/or on-screen closed captioning ("CC"). For example, and referring to FIGS. 1A, 1B, and 1C, a viewer is seen viewing a content playback device 12 with no background disruption (FIG. 1A). Referring next to FIG. 1B, a lawnmower is seen outside of the window, and subsequently it would be expected that the viewer might have trouble hearing the audio from the content playback device 12, and so according to systems and methods according to present principles, the volume may be automatically adjusted as shown by volume indicator 14. The content playback device (or other operably coupled device) detects the change in volume by way of a device such as a microphone 16. The viewer may then continue to enjoy the content as indicated in FIG. 1C. When the lawnmower goes away (not shown), the volume may then automatically be caused to decrease back to the level the viewer had set it in FIG. 1A.

Figure 2:
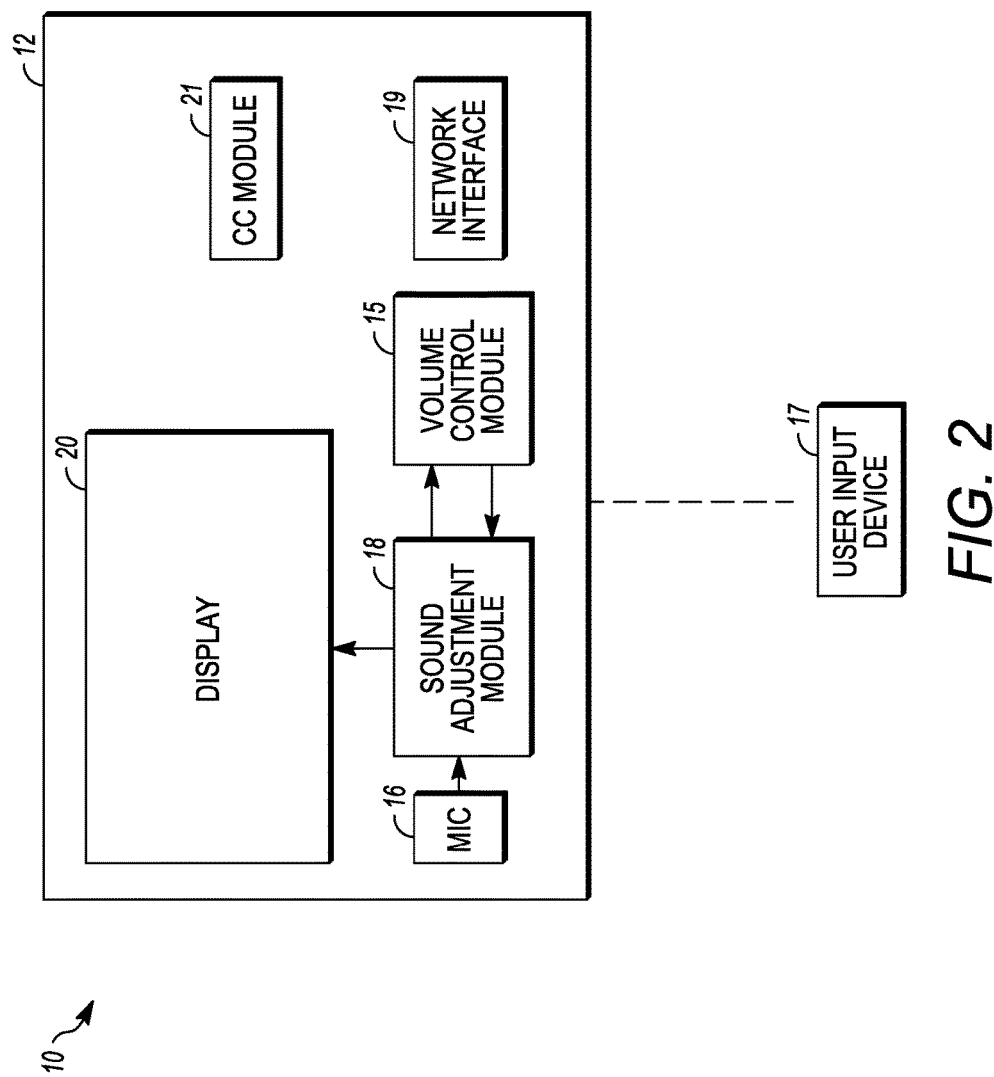
FIG. 2 is a system level diagram of a device according to present principles.

FIG. 2 illustrates a system level diagram 10 of an exemplary arrangement. The content playback device 12 is indicated along a display 20 and a network interface 19 configured to receive content. To perform the steps described here, the content playback device 12 also includes a microphone 16, which may be integral with the content playback device 12 or may be external but in operable connection with the content playback device 12.

A user input device 17 is illustrated, which may be a remote control, second display, or the like, and the same may be employed to initially set a desired volume using a volume control module 15 within the content playback device. The volume control module 15 generally accepts or receives input from sources such as the user input device 17 or a sound adjustment module 18 to control the volume of the device, generally by operating a potentiometer or a voltage-regulated amplifier or in other known fashion. The microphone 16 and volume control module 15 constitute one means for determining a desired content audio level or CAL, i.e., the volume level at which the user desires to view and enjoy the content. The output from this means may be transmitted to the sound adjustment module 18 to perform the calculations described below.

The sound adjustment module accepts input from the microphone 16 and controls the volume control module 15 according to its programming. The sound adjustment module 18 may also control aspects of the display 20 of the content playback device. For example, the sound adjustment module according to its logic and programming may cause the display of closed captioning on the display 20. The sound adjustment module may accomplish the steps described here by use of a suitably designed ASIC or suitably programmed processor.

The sound adjustment module 18 may also be implemented by suitable additional programming of the volume control of the content playback device, e.g., by additional logic or programming within the volume control module 15. That is, it need not be implemented as a separate physical module; however, it is generally implemented as a separate logical module or as logic within the volume control. In one implementation, the sound adjustment module 18 according to present principles is incorporated or integrated into volume control firmware within video/audio/gaming devices.

The sound adjustment module 18 may be configured to receive an input from the microphone 16, and if the input from the microphone 16 detects a sustained increase in the BBNL, then the sound adjustment module 18 may be configured to command the volume control module 15 to automatically cause an increase in the CAL to compensate for the detected sustained increase in the BBNL, or to command the closed captioning module 21 to display closed captioning of the received digital content, or both.

Other components within the system 10 may include the network interface 19 for receiving digital content. Access may be made of a closed captioning module 21 configured to, upon receipt of a closed captioning command from the sound adjustment module, display closed captioning of the received digital content.

Figure 3:
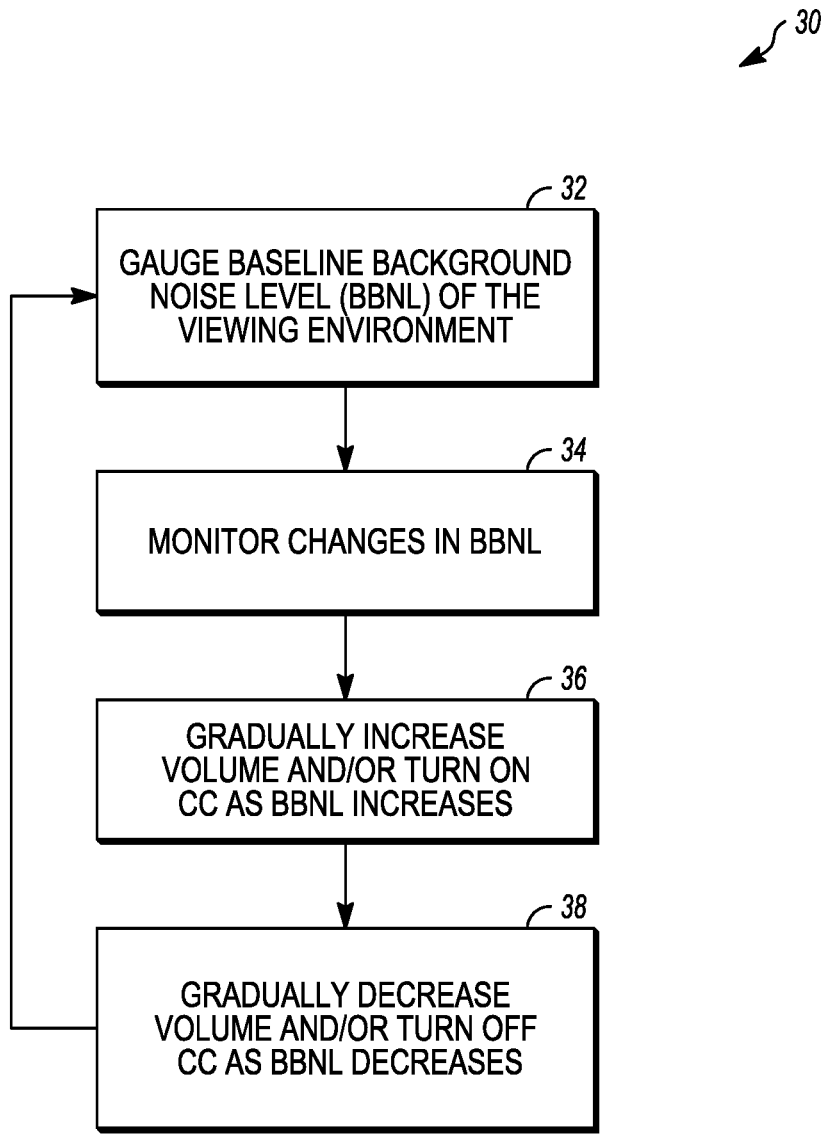
FIG. 3 is a flowchart of an exemplary method according to present principles.

Referring to FIG. 3, an exemplary method is illustrated by the flowchart 30. In a first step, during a viewing or listening or gaming session, systems and methods according to present principles may employ the built-in or external microphone 16 to gauge a baseline background noise level of the viewing environment (step 32). The sound adjustment module 18 may accept or receive inputs from the microphone 16 as well, and may monitor changes in the BBNL (step 34). The sound adjustment module 18 may then gradually increase the volume as the BBNL increases (step 36). In the same way, the BBNL may be caused to gradually decrease the volume as the BBNL decreases (step 38). As noted in the figure, closed captioning may also be caused by the sound adjustment module 18, and either turned on or off instead of increasing the volume or in addition thereto. The determination of whether to increase the volume or turn on CC may be set by the user within device settings within the content playback device 12.

The sound adjustment module 18 may also be programmed or tuned to make exceptions for noises that do not significantly impact the BBNL, or which only impact the same for a short term, such termed "excepted BBNL increases". For example, the sound adjustment module 18 may be tuned to not increase the volume as a result of sporadic or unsustained sounds, e.g., an object dropping or a doorbell. Similarly, the sound adjustment module 18 may be tuned to not adjust the volume as a result of proximate speech, e.g., a conversation between the viewers. For example, a conversation between the viewers may be picked up by the microphone 16 and such sounds may be analyzed in their frequency content. The frequency content of a conversation is significantly different than the frequency content of, e.g., a lawnmower or overhead plane. Accordingly, by analysis of the frequency content, the sound adjustment module 18 may distinguish between different types of sounds and be programmed to raise the volume (or not) accordingly.

Figure 4:
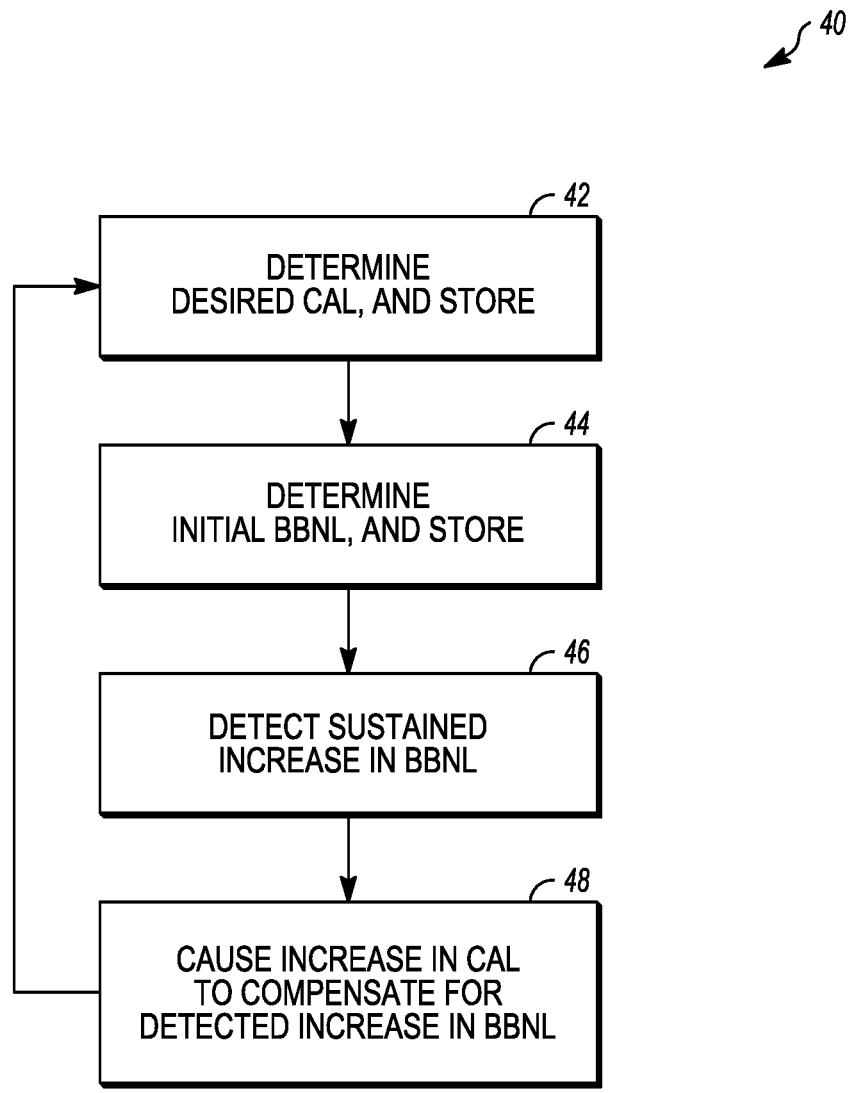
FIG. 4 is a flowchart of another exemplary method according to present principles.

In an exemplary user flow, as shown by the flowchart 40 of FIG. 4, the user turns on the content playback device and adjusts the volume using the volume control 15 as necessary and as desired (step 42). This is termed the "desired CAL", or desired content audio level and this volume level is detected and stored. An initial BBNL is also detected (step 44) and stored. The BBNL is monitored and a "sustained increase" may be detected (step 46), where the sustained increase is an increase in the BBNL that is greater than a predetermined threshold and which is not an excepted BBNL increase, where an excepted BBNL increase pertains to, e.g., proximate speech or to short duration sounds, e.g., those that have a duration or which last for less than a predetermined period of time, e.g., 1-2 seconds. For example, a garbage truck may be passing by outside, or as noted above a lawnmower or plane may fly overhead, and an increase in volume would be warranted. However, if the user drops the remote control onto the floor, the subsequent sound would generally have a duration less than the predetermined period of time, and would thus constitute an exception as an excepted BBNL increase.

Upon detecting a sustained increase in the BBNL, the sound adjustment module may automatically cause an increase in the content audio level to compensate for the detected sustained increase in the BBNL (step 48). In one example, the volume may be raised proportionally to the increase in background noise. For example, if the BBNL rises by 5 dB, the CAL may be caused to increase by 5 dB. Alternatively, if the BBNL rises by a specific percentage, the CAL may be caused to increase by the same percentage. Alternatively, or in addition, closed captioning may be turned on. When the background noise goes down, e.g., the garbage truck moves on to the next block, systems and methods may automatically return the volume to the desired CAL, and/or turn off closed captioning. Automatically causing display of closed captioning may provide the benefit of further compensating for the detected sustained increase.

The speed at which the volume increases or decreases may also be controlled, and such may be caused to be gradual, e.g., a few dB per minute (or second). In some cases, the predetermined threshold of time for excepted BBNL increases may be very short, e.g., 0.5 seconds, but the level at which the increase in volume occurs may be gradual, so that if an intermittent sound occurs, the volume may increase, but not in a way or at a speed which is annoying to the viewer.

As noted above, the CAL may be caused to increase at least proportionally to the increase in the BBNL. In a particular implementation, the amount of increase in the CAL is caused by determining a metric based on the initial BBNL and the desired CAL, and the automatic increase in the CAL may be such that the value of the metric is unchanged. For example, the metric may be a signal-to-noise ratio.

Also as noted above, exceptions may be provided within the sound adjustment module that do not cause an increase in the volume or which otherwise suppress such a potential increase. For example, one exception may be proximate speech, where proximate speech causes an increase in the BBNL, then the automatic increase in the CAL may be suppressed at least as due to the proximate speech. Another exception may be increases in BBNL that do not exceed a predetermined threshold in volume, e.g., a threshold measured in dB. Conversely, if the increase in BBNL exceeds a threshold, then the logic within the sound adjustment module may cause an automatic increase to be performed. An exemplary predetermined threshold for sound volume may be 75 dB, where if the increase in BBNL is less than this threshold number, the system may be programmed or configured to not increase the volume or CAL. Similarly, a sustained increase may be one that lasts greater than a predetermined duration, e.g., greater than 1-2 seconds.

The system and method may be fully implemented in any number of computing devices which form part of or are in operable signal communication with content display and playback devices. Typically, instructions are laid out on computer readable media, generally non-transitory, and these instructions are sufficient to allow a processor in the computing device to implement the method of the invention. The computer readable medium may be a hard drive or solid state storage having instructions that, when run, are loaded into random access memory. Inputs to the application, e.g., from the plurality of users or from any one user, may be by any number of appropriate computer input devices. For example, users may employ a keyboard, mouse, touchscreen, joystick, trackpad, other pointing device, remote control, second display or any other such computer input device to input data relevant to the method. Data may also be input by way of an inserted memory chip, hard drive, flash drives, flash memory, optical media, magnetic media, or any other type of file—storing medium. The outputs may be delivered to a user by way of a video graphics card or integrated graphics chipset coupled to the above-noted display that maybe seen by a user. Any number of other tangible outputs will also be understood to be contemplated by the invention. For example, outputs may be stored on a memory chip, hard drive, flash drives, flash memory, optical media, magnetic media, or any other type of output. A networked system may provide a suitable computing environment for an implementation in which a plurality of users provide separate inputs to the system and method. In the system where control of a content playback device is contemplated, the plural inputs may allow plural users to provide input at the same time.

While the invention herein disclosed is capable of obtaining the objects hereinbefore stated, it is to be understood that this disclosure is merely illustrative of the presently preferred embodiments of the invention and that no limitations are intended other than as described in the appended claims. For example, the invention can be used in a wide variety of settings, e.g., in the applications of entertainment consumption, video gaming, education, and so on.

The invention claimed is:

1. A method of improving delivery of audio content during a content playback experience, comprising:

a. detecting an initial baseline background noise level;
b. determining a desired content audio level;
c. detecting a sustained increase in the baseline background noise level;
d. automatically causing an increase in the content audio level to compensate for the detected sustained increase in the baseline background noise level; and
e. detecting proximate speech, wherein if proximate speech is detected, and if the proximate speech causes an increase in the baseline background noise level, then suppressing the automatic increase in the content audio level caused by the increase in baseline background noise level due to the proximate speech.

2. The method of claim 1, further comprising automatically causing display of closed-captioning to further compensate for the detected sustained increase in the baseline background noise level.

3. The method of claim 1, further comprising causing the content audio level to decrease when the increased baseline background noise level is no longer detected.

4. The method of claim 1, wherein the increase in the content audio level is at least proportional to the increase in the baseline background noise level.

5. The method of claim 1, further comprising determining a metric based on the initial baseline background noise level and the desired content audio level, wherein the automatic increase in the content audio level is such that the value of the metric is unchanged.

6. The method of claim 5, wherein the metric is a signal-to-noise ratio.

7. The method of claim 1, further comprising detecting if the increase in baseline background noise level exceeds a threshold, and if so, then performing the automatic increase in the content audio level.

8. The method of claim 1, wherein the sustained increase is a sound increase greater than a predetermined threshold and which does not constitute an excepted baseline background noise level increase.

9. The method of claim 8, wherein an excepted baseline background noise level increase is one that is determined to be proximate speech or one that has a duration less than a predetermined threshold period of time.

10. The method of claim 9, wherein the predetermined threshold period of time is one second.

11. The method of claim 8, wherein the predetermined threshold of the sound increase is 75 dB.

12. A method of improving delivery of audio content during a content playback experience, comprising:
a. detecting an initial baseline background noise level;
b. determining a desired content audio level;
c. detecting a sustained increase in the baseline background noise level, wherein the detected sustained increase is determined to not corresponding to approximate speech; and
d. automatically causing display of closed-captioning to compensate for the detected sustained increase in the baseline background noise level.

13. The method of claim 12, further comprising automatically causing an increase in the content audio level to further compensate for the detected sustained increase in the baseline background noise level.

14. A system with improved delivery of audio content during a content playback experience, comprising:
a. a network interface for receiving digital content;
b. a display for displaying received digital content;
c. a microphone for receiving sound including an initial baseline background noise level and a desired content audio level;
d. a means for determining the desired content audio level;
e. a volume control module configured to control a playback volume of the digital content;
f. a closed captioning module configured to, upon receipt of a closed captioning command, display closed captioning of the received digital content; and
g. a sound adjustment module configured to receive an input from the microphone, and if the input from the microphone detects a sustained increase in the received sound, then the sound adjustment module is configured to command the volume control module to automatically cause an increase in the content audio level to compensate for the detected sustained increase in the received sound, or to command the closed captioning module to display closed captioning of the received digital content, or both, wherein the sustained increase is a sound increase greater than a predetermined threshold and which does not constitute proximate speech.

15. The system of claim 14, wherein the sound adjustment module is further configured to, upon detecting a decrease in the received sound, command the volume control module to automatically cause a decrease in the content audio level, or command the closed captioning module to suppress display of closed captioning of the received digital content, or both.

16. The system of claim 14, wherein an excepted baseline background noise level increase further is one that has a duration less than a predetermined threshold period of time.

17. The system of claim 16, wherein the predetermined threshold period of time is one second.

18. The system of claim 14, wherein the predetermined threshold of the sound increase is 75 dB.

* * * * *